United States Patent [19]

Kurita et al.

[11] Patent Number: 5,130,803
[45] Date of Patent: Jul. 14, 1992

[54] SATELLITE BROADCASTING TUNER

[75] Inventors: Tadashi Kurita, Kanagawa; Koji Hirosawa, Chiba, both of Japan

[73] Assignee: Sony Corporation, Tokyo, Japan

[21] Appl. No.: 744,245

[22] Filed: Aug. 13, 1991

[30] Foreign Application Priority Data

Aug. 20, 1990 [JP] Japan ................. 2-216973

[51] Int. Cl.$^5$ .............................................. H04N 5/50
[52] U.S. Cl. .............................. 358/191.1; 358/195.1; 358/198; 455/164.1; 455/182.1
[58] Field of Search ....................... 358/188, 189, 191.1, 358/193.1, 194.1, 195.1, 192.1, 198; 455/182, 192, 164

[56] References Cited

U.S. PATENT DOCUMENTS

| | | | |
|---|---|---|---|
| 4,748,684 | 5/1988 | Wright | 358/195.1 |
| 4,941,050 | 7/1990 | Bird | 358/191.1 |
| 4,975,775 | 12/1990 | Satoh | 358/191.1 |
| 5,014,350 | 5/1991 | Nezu | 358/191.1 |

Primary Examiner—Howard W. Britton
Assistant Examiner—Sherrie Hsia
Attorney, Agent, or Firm—Lewis H. Eslinger; Jay H. Maioli

[57] ABSTRACT

A satellite broadcasting tuner by use of which high-definition television broadcasting of a satellite broadcasting channel can be received in a high quality. The satellite broadcasting tuner receives a satellite broadcasting channel selected by a channel selecting microcomputer, and when frame synchronizing data of the high-definition television system are detected from within audio data of the received channel, the reception frequency for the channel is fixed to receive the high-definition television broadcasting, but when no such frame synchronizing data are detected, an ordinary automatic fine tuning function operates to receive the satellite broadcasting channel. Changing over circuit is provided to take, when such frame synchronizing data are detected, a keyed automatic frequency control pulse signal into the channel selecting microcomputer from an external MUSE decoder to which video data of the received channel are transmitted so that the channel selecting microcomputer may perform a keyed automatic fine tuning operation.

2 Claims, 2 Drawing Sheets

SATELLITE BROADCASTING TUNER

BACKGROUND OF THE INVENTION

1. Field of the Invention

This invention relates to a satellite broadcasting tuner which can cope with high-definition television satellite broadcasting which is broadcast in the MUSE (Multiple Sub-Nyquist Sampling Encoding) system.

2. Description of the Prior Art

Reception of satellite broadcasting which is broadcast making use of a communications satellite requires a down converter for converting a frequency of radio waves of satellite broadcasting received, for example, by way of a parabola antenna, and a satellite broadcasting tuner for selecting a desired broadcasting channel from within an output of the down converter and demodulating a video signal of the selected broadcasting channel. Such satellite broadcasting tuner receives a signal having a frequency of 1 GHz obtained by down-conversion by a down converter and frequency converts the received signal to form an intermediate frequency in which video signals of several channels are included. Such satellite broadcasting tuner has an AFT (automatic fine tuning) function wherein a local oscillation frequency supplied to a frequency converter is controlled in accordance with a level of a demodulated video signal so that an appropriate intermediate frequency may be obtained automatically (average value AFT).

By the way, when a high-definition television signal which provides a video signal of a high definition is transmitted using a satellite broadcasting channel, the signal band of such high-definition television signal is wider than that of ordinary satellite broadcasting. For example, if a high-definition television signal is transmitted in accordance with the MUSE system wherein the base band is compressed to 8:1 MH, then a satellite broadcasting tuner must necessarily have at least a reception bandwidth of 27 MH or so. Consequently, if a selected channel frequency of a satellite broadcasting channel in which a high-definition television signal is broadcast is controlled in accordance with such average AFT as described above, then it is difficult to cause a central value of a frequency band of the desired satellite broadcasting channel to coincide with a central frequency of an intermediate frequency of a satellite broadcasting tuner, and consequently, the quality of a video signal is deteriorated.

Thus, the applicant of the present patent application has provided a satellite broadcasting tuner with a channel selecting apparatus wherein, when a satellite broadcasting channel in which a high-definition television signal is broadcast is selected, frame synchronizing data included in an audio signal constituting such high-definition television signal are detected, and then when such frame synchronizing data are detected, an average value AFT operation is stopped and a channel selecting frequency is fixed for reception of the channel.

With a tuner of such channel selecting frequency selecting system, since a frame synchronizing data signal is detected from within a received signal to detect that a channel being received at present is a high-definition television broadcasting channel and then a channel selecting frequency is fixed so that a central value of an intermediate frequency which is formed by the channel selecting frequency may coincide with a central value of a signal band frequency of the MUSE system, high-definition television broadcasting can be received in a high quality. However, the tuner has a problem that, if the frequency of a converter for lowering the frequency of radio waves received, for example, by way of a parabola antenna varies, then the central frequency varies following such variation.

SUMMARY OF THE INVENTION

It is an object of the present invention to provide a satellite broadcastiing tuner by means of which high-definition television broadcasting of a satellite broadcasting channel can be received in a high quality.

It is another object of the present invention to provide a satellite broadcasting tuner by means of which high-definition television broadcasting can be received even when a keyed automatic frequency control pulse signal is not received by some cause.

In order to attain the objects, according to the present invention, there is provided a satellite broadcasting tuner which comprises means for receiving a signal in which signals of various satellite broadcasting channels are included, channel selecting means for developing a frequency signal representative of a channel selecting frequency of a satellite broadcasting channel to be selected, frequency selecting means for selecting a frequency corresponding to the frequency signal from within the received signal, automatic fine tuning signal developing means for developing an automatic fine tuning signal from the selected frequency, separating means for separating the selected frequency into a video signal and an audio signal, the video signal being transmitted to an external decoder which develops a keyed automatic frequency control pulse signal in response to such video signal, detecting means for detecting frame synchronizing data of the high-definition television system from the audio signal from the separating means and developing a detection signal when such frame synchronizing data are detected, and changing over means for transmitting the keyed automatic frequency control pulse signal from the external decoder to the channel selecting means when the detection signal is received from the detecting means, wherein the channel selecting means performs an ordinary automatic fine tuning operation in response to the automatic fine tuning signal from the automatic fine tuning signal developing means when no detection signal is received from the detecting means, but fixes, when the detection signal is received, the channel selecting frequency to the frequency of the satellite broadcasting channel being received except when the keyed automatic frequency control pulse signal is received by way of the changing over means and the channel selecting means performs a keyed automatic fine tuning operation in response to the received keyed automatic frequency control pulse signal. The channel selecting means may include a channel selecting microcomputer to which an external channel selecting instruction is supplied.

Since such keyed automatic frequency control pulse signal as is supplied from the external decoder represents a clamp level formed in a particular region of a video signal of a high-definition television signal, if the channel selecting frequency is controlled so that a detection output may correspond to a clamp level only for a period of such keyed automatic frequency control pulse signal, then an intermediate frequency of the satellite broadcasting channel for which high-definiton television radio waves are received can be made coincide completely with a central frequency of a high-definition television signal band of the MUSE system. Thus, with the satellite broadcasting tuner of the invention, since it comprises the changing over circuit which receives a keyed automatic frequency control pulse signal from an external decoder such as a MUSE decoder, high-definition television broadcasting of a high-definition television satellite broadcasting channel can be received in a high quality due to a keyed automatic fine tuning operation of the channel selecting means. Further, even when such keyed automatic control pulse signal disappears by some cause while a high-definition television signal is being received, the channel selecting frequency for the high-definition satellite broadcasting channel is prevented from varying to a great extent and consequently the high-definition television satellite broadcasting can be received. Further, ordinary satellite broadcasting can be received in a high quality. Consequently, the satellite broadcasting tuner provides various manners of use.

The above and other objects, features and advantages of the present invention will become apparent from the following description and the appended claims, taken in conjunction with the accompanying drawings.

DETAILED DESCRIPTION OF THE PREFERRED EMBODIMENT

Figure 1:
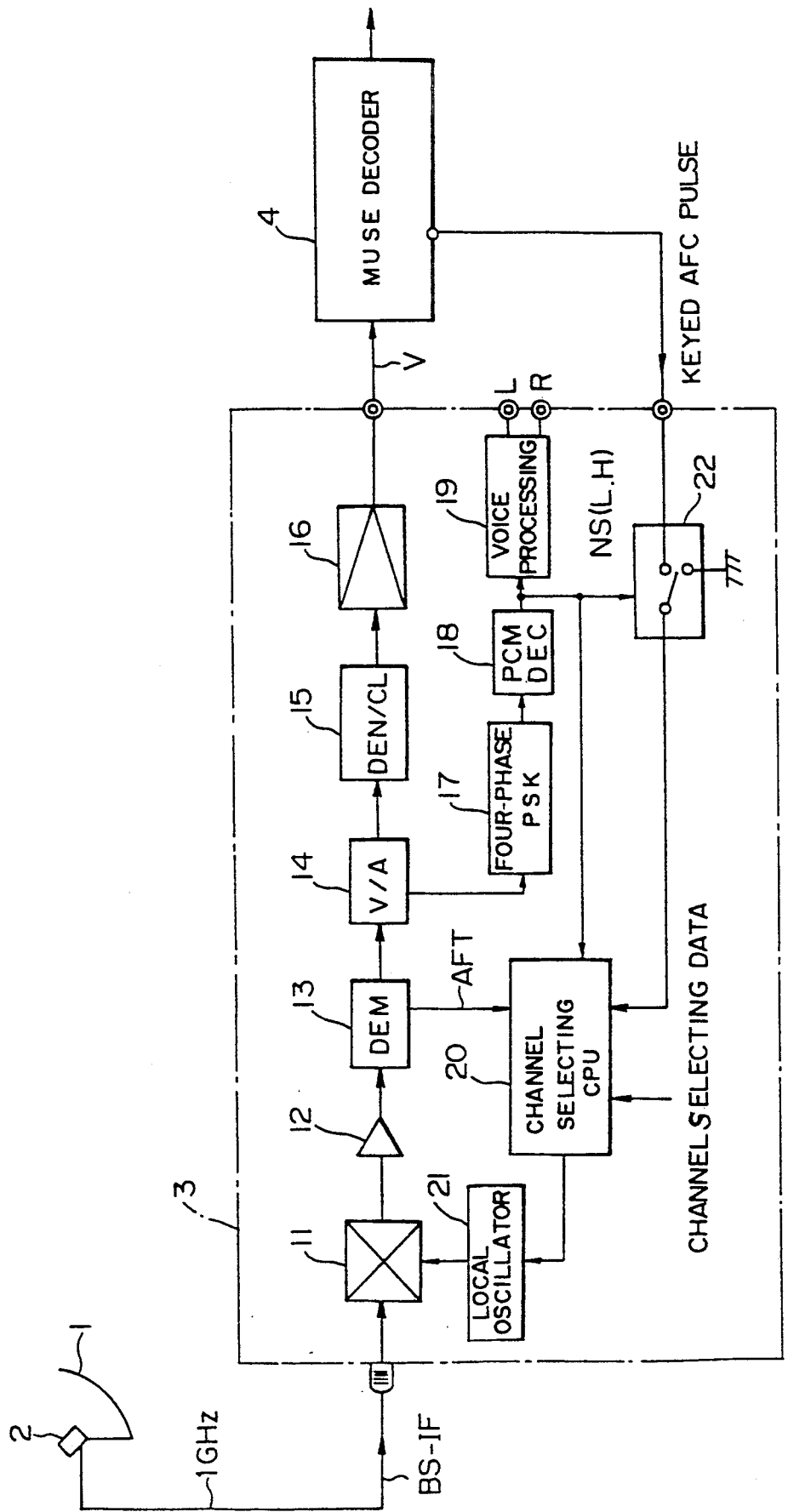
FIG. 1 is a block diagram of a satellite broadcasting tuner showing a preferred embodiment of the present invention.

Referring first to FIG. 1, there is shown a satellite broadcasting tuner to which the present invention is applied. The satellite broadcasting tuner (BS tuner) is generally denoted at 3 and connected to a down converter 2 connected to a parabola antenna 1. The satellite broadcasting tuner 3 thus receives from the down converter 2 a BS-IF signal of a frequency of 1 GHz obtained by frequency conversion, selects a desired channel frequency from within the received frequency and demodulates the thus selected channel frequency. The satellite broadcasting tuner 3 includes a frequency converter 11, an intermediate frequency amplifier 12, a demodulator 13, a video/audio data separating circuit 14, a de-emphasis circuit 15 and a video signal processing circuit 16.

The satellite broadcasting tuner 3 further includes a four-phase PSK demodulating circuit 17 for demodulating audio data. Demodulated data from the four-phase PSK demodulating circuit 17 are supplied to a PCM (Pulse Code Modulation) decoder 18 and then inputted to an audio processing circuit 19, from which they are outputted as a stereo analog audio signal.

Figure 2:
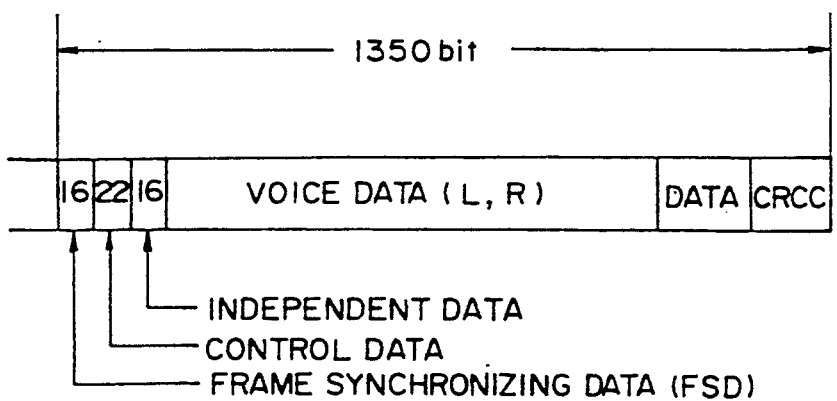
FIG. 2 is a diagrammatic representation illustrating frame synchronizing data.

The PCM decoder 18 has a function of detecting frame synchronizing data FSD (16 bits) from within high-definition television audio data (1,350 bits) of one frame which are compressed on the time base in such a manner as illustrated, for example, in FIG. 2, and outputs a detection signal NS which exhibits a high (H) level when such frame synchronizing data FSD are detected. The detection signal NS exhibits a low (L) level when such frame synchronizing data FSD are not detected. Such detection signal NS is supplied to a channel selecting microcomputer 20 and used to control a channel selecting operation of the latter as hereinafter described. The detection signal NS is also used to control a change-over switch 22 so that a keyed AFC (automatic frequency control) pulse signal is supplied to the channel selecting microcomputer 20.

The satellite broadcasting tuner 3 further includes a local oscillator 21 which develops local oscillations, which are mixed with a BS-IF signal from the down converter 2 at the frequency converter 11 to form an intermediate frequency of a desired channel.

In the satellite broadcasting tuner 3 having such construction as described above, a BS-IF signal supplied from the down converter 2 is mixed with a frequency (channel selecting frequency) of the local oscillator 21 which depends upon channel selecting data supplied to the channel selecting microcomputer 20 so that an intermediate frequency of a desired channel is formed, and such intermediate frequency is demodulated to develop and output a video signal.

When such video signal is of ordinary satellite broadcasting, it is supplied to a monitor television set as it is while the channel selecting microcomputer 20 is controlled in accordance with an AFT signal outputted from the demodualtor 13 to perform an automatic frequency tuning (AFT) operation.

Meanwhile, since a detection signal NS is not developed when such ordinary satellite broadcasting is being received, the change-over switch 22 is grounded.

On the other hand, when the satellite broadcasting tuner 3 receives a channel of high-definition television broadcasting which is broadcast in the MUSE system, such detection signal NS as described above is developed from the PCM decoder 18 and supplied to the channel selecting microcomputer 20. In response to such detection signal NS, the average value AFC operation is stopped and the local oscillator 21 is controlled so that a specific local oscillation frequency for reception of the high-definition television broadcasting channel may be supplied to the frequency converter 11. A demodulation output of a high-definition television signal then is inputted to the MUSE decoder 4 at a next stage, and a high-definition television video signal is formed by a MUSE decoder 4 at a next stage and supplied to a monitor television set not shown. In case the monitor television set is not of the high-definition television compatible type but of an ordinary type, such high-definition television signal will be supplied from the MUSE decoder 4 to a MUSE-NTSC converting decoder, in which it is converted into an NTSC television signal, which is then supplied to the monitor television set of such ordinary type.

When a high-definition television video signal is demodualted, a keyed AFC pulse signal is outputted from the MUSE decoder 4 and taken into the channel selecting microcomputer 20 by the way of the change-over switch circuit 22. Consequently, the microcomputer 20 executes an AFT operation only for a period of such keyed AFC pulse signal and controls so that a received condition of the channel in which high-definition television broadcasting is involved may be maintained accurately. In particular, the microcomputer 20 executes such a keyed AFT operation that an intermediate frequency of high-definition television signal being transmitted in the MUSE system may be the center of a signal band of the intermediate frequency amplifier 12.

Figure 3:
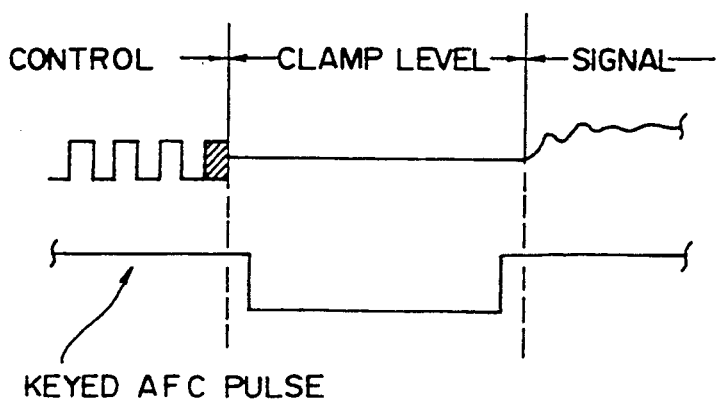
FIG. 3 is a waveform diagram of a keyed AFC pulse signal.

FIG. 3 illustrates a phase relationship between a keyed AFC pulse signal and a demodulated high-definition television signal. As seen in FIG. 3, a keyed AFC pulse signal is formed so that a shadowed portion of a clamp level provided at a predetermined location of a high-definition television signal may be detected. Then, an AFT operation is performed for a period of time when the keyed AFC pulse presents an L level.

It is to be noted that, when a keyed AFC pulse signal is not produced by some cause (when the keyed AFC pulse signal presents an L level) even in a condition wherein such high-definition television satellite broadcasting channel is being received, the channel selecting frequency of the satellite broadcasting tuner 3 is fixed so as to receive the high-definition television channel in accordance with a detection signal NS supplied to the channel selecting microcomputer 20.

Having now fully described the invention, it will be apparent to one of ordinary skill in the art that many changes and modifications can be made thereto without departing from the spirit and scope of the invention as set forth herein.

What Is Claimed Is:

1. A satellite broadcasting tuner, comprising means for receiving a signal in which signals of various satellite broadcasting channels are included, channel selecting means for developing a frequency signal representative of a channel selecting frequency of a satellite broadcasting channel to be selected, frequency selecting means for selecting a frequency corresponding to the frequency signal from within the received signal, automatic fine tuning signal developing means for developing an automatic fine tuning signal from the selected frequency, separating means for separating the selected frequency into a video a signal and an audio signal, the video signal being transmitted to an external decoder which develops a keyed automatic frequency control pulse signal in repsonse to such video signal, detecting means for detecting frame synchronizing data of the high-definition television system from the audio signal from said separating means and developing a detection signal when such frame synchronizing data are detected, and changing over means for transmitting the keyed automatic frequency control pulse signal from the external decoder to said channel selecting means when the detection signal is received from said detecting means, wherein said channel selecting means performs an ordinary automatic fine tuning operation in response to the automatic fine tuning signal from said automatic fine tuning signal developing means when no detection signal is received from said detecting means, but fixes, when the detection signal is received, the channel selecting frequency to the frequency of the satellite broadcasting channel being received except when the keyed automatic frequency control pulse signal is received by way of said changing over means and said channel selecting means performs a keyed automatic fine tuning operation in response to the received keyed automatic fequency control pulse signal.

2. A satellite broadcasting tuner according to claim 1, wherein said channel selecting means includes a channel selecting microcomputer to which an external channel selecting instruction is supplied.

* * * * *